(12) United States Patent
Suri et al.

(10) Patent No.: US 9,015,094 B2
(45) Date of Patent: Apr. 21, 2015

(54) DELAY GENERATOR USING A PROGRAMMABLE RESISTOR BASED ON A PHASE-CHANGE MATERIAL

(75) Inventors: Manan Suri, Grenoble (FR); Barbara De Salvo, Montbonnot Saint Martin (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 183 days.

(21) Appl. No.: 13/531,226

(22) Filed: Jun. 22, 2012

(65) Prior Publication Data

US 2012/0330873 A1 Dec. 27, 2012

(30) Foreign Application Priority Data

Jun. 27, 2011 (FR) ..................... 11 55698

(51) Int. Cl.

| G06F 15/18 | (2006.01) |
|---|---|
| G06J 1/00 | (2006.01) |
| G06N 3/00 | (2006.01) |
| G06E 1/00 | (2006.01) |
| G06E 3/00 | (2006.01) |
| G06G 7/00 | (2006.01) |
| G11C 11/00 | (2006.01) |
| H01L 45/00 | (2006.01) |
| H03K 5/13 | (2014.01) |
| H03K 5/00 | (2006.01) |

(52) U.S. Cl.
CPC ............... *H01L 45/06* (2013.01); *H01L 45/04* (2013.01); *H03K 5/13* (2013.01); *H03K 2005/00026* (2013.01); *H03K 2005/00156* (2013.01)

(58) Field of Classification Search
None
See application file for complete search history.

(56) References Cited

U.S. PATENT DOCUMENTS 6,967,344 B2 * 11/2005 Ovshinsky et al. ............... 257/2
7,012,834 B2 * 3/2006 Cho et al. ....................... 365/163

(Continued)

FOREIGN PATENT DOCUMENTS

JP 63-312715 A 12/1988
WO 2011074021 A1 6/2011

OTHER PUBLICATIONS

Sonoda, Ken'ichiro, et al. "A compact model of phase-change memory based on rate equations of crystallization and amorphization." Electron Devices, IEEE Transactions on 55.7 (2008): 1672-1681.*

(Continued)

*Primary Examiner* — Kakali Chaki
*Assistant Examiner* — Daniel Pellett
(74) *Attorney, Agent, or Firm* — BakerHostetler LLP

(57) ABSTRACT

A delay generator comprises at least one programmable resistor $R_{PCM}$ made of a chalcogenide-based phase-change material, said resistor $R_{PCM}$ being initialized, so as to generate a delay, in a way such that the resistance of the resistor $R_{PCM}$ equals a pre-set initial value $R_0$ and such that the chalcogenide is in the amorphous phase, and a comparator comparing a reference electrical quantity that is stable over time with a variable electrical quantity representative of the resistance of the programmable resistor $R_{PCM}$, the comparator generating a singularity signal s, said singularity being generated when the difference between the two electrical quantities changes sign.

11 Claims, 3 Drawing Sheets

(56) References Cited

U.S. PATENT DOCUMENTS

| | | | |
|---|---|---|---|
| 7,085,155 B2* | 8/2006 | Ovshinsky et al. | 365/163 |
| 7,186,998 B2* | 3/2007 | Ovshinsky et al. | 257/3 |
| 7,548,894 B2* | 6/2009 | Fuji | 706/33 |
| 7,813,167 B2* | 10/2010 | Porter | 365/163 |
| 7,869,270 B2* | 1/2011 | Lee | 365/163 |
| 7,969,769 B2* | 6/2011 | Lowrey | 365/163 |
| 8,605,531 B2* | 12/2013 | Kau | 365/212 |
| 2006/0203541 A1* | 9/2006 | Toda | 365/163 |
| 2007/0285971 A1* | 12/2007 | Toda et al. | 365/148 |
| 2010/0008133 A1* | 1/2010 | Cho et al. | 365/163 |
| 2011/0103139 A1* | 5/2011 | Kau et al. | 365/163 |

OTHER PUBLICATIONS

Ielmini, Daniele, and Yuegang Zhang. "Analytical model for sub-threshold conduction and threshold switching in chalcogenide-based memory devices." Journal of Applied Physics 102.5 (2007): 054517.*

Karpov, I. V., et al. "Fundamental drift of parameters in chalcogenide phase change memory." Journal of Applied Physics 102.12 (2007): 124503.*

Yu, Shimeng, and H-SP Wong. "Modeling the switching dynamics of programmable-metallization-cell (PMC) memory and its application as synapse device for a neuromorphic computation system." Electron Devices Meeting (IEDM), 2010 IEEE International. IEEE, 2010.*

Caulfield, Adrian M., et al. "Moneta: A high-performance storage array architecture for next-generation, non-volatile memories." Proceedings of the 2010 43rd Annual IEEE/ACM International Symposium on Microarchitecture. IEEE Computer Society, 2010.*

Versace, Massimiliano, and Ben Chandler. "The brain of a new machine." IEEE spectrum 47.12 (2010): 30-37.*

Kuzum, Duygu, et al. "Nanoelectronic programmable synapses based on phase change materials for brain-inspired computing." Nano letters 12.5 (2011): 2179-2186.*

Jo, Sung Hyun, et al. "Nanoscale memristor device as synapse in neuromorphic systems." Nano letters 10.4 (2010): 1297-1301.*

Raoux, Simone. Phase change materials. Ed. Matthias Wuttig. Springer, 2009.*

Wong, H-SP, et al. "Phase change memory." Proceedings of the IEEE 98.12 (2010): 2201-2227.*

Wuttig, Matthias, and Noboru Yamada. "Phase-change materials for rewriteable data storage." Nature materials 6.11 (2007): 824-832.*

Ielmini, Daniele, Andrea L. Lacaita, and Davide Mantegazza. "Recovery and drift dynamics of resistance and threshold voltages in phase-change memories." Electron Devices, IEEE Transactions on 54.2 (2007): 308-315.*

Kim, Jin-Ki; WO 2011/134055 A1 "Write Scheme in Phase Change Memory".*

Daniele Ielmini, et al, "Reliability Impact of Chalcogenide-Structure Relaxation in Phase-change Memory (PCM) Cells—Part I: Experimental Study", IEEE Transactions on Electron Devices, May 1, 2009, pp. 1070-1077, vol. 56, No. 5, IEEE Service Center, Piscataway, NJ, USA, XP011254208.

William F Davis, et al., "A Precision Monolithic Time-Delay Generator for Use in Automotive Electronic Fuel Injection Systems", IEEE Journal of Solid-State Circuits, Dec. 1972, pp. 462-469, vol. SC-7, No. 6.

* cited by examiner

DELAY GENERATOR USING A PROGRAMMABLE RESISTOR BASED ON A PHASE-CHANGE MATERIAL

CROSS-REFERENCE TO RELATED APPLICATION

This application claims priority to foreign French patent application No. FR 1155698, filed on Jun. 27, 2011, the disclosure of which is incorporated by reference in its entirety.

FIELD OF THE INVENTION

The invention relates to a delay generator using a programmable resistor based on a phase-change material. It is notably applicable to the field of electronic devices for generating time delays.

BACKGROUND

The need to generate precise time delays is a requirement in many electronic applications. For this purpose, capacitor-based circuits are customarily used to generate time delays. Examples of such circuits are described in the article by W. F. Davis and T. M. Frederiksen entitled *a precision monolithic time-delay generator for use in automotive electronic fuel injection systems*, IEEE journal on solid state circuits, Vol. 7, No. 6, December 1972.

One of the drawbacks of this type of circuit is their footprint, notably when they are incorporated into an integrated circuit. Another drawback is that they cannot generate a wide range of time delays, for example with values ranging from one millisecond to several hundred minutes. Furthermore, if a capacitor-based delay generator is used, it is difficult to generate long delays, of about one hundred seconds for example, with precision.

SUMMARY OF THE INVENTION

An aim of the invention is notably to mitigate the aforementioned drawbacks.

For this purpose, one subject of the invention is a delay generator comprising at least one programmable resistor $R_{PCM}$ made of a chalcogenide-based phase-change material. Said resistor $R_{PCM}$ is initialized, to generate a delay, in a way such that the resistance of the resistor $R_{PCM}$ equals an initial value $R_0$ and such that the chalcogenide is in the amorphous phase. A comparator compares a reference electrical quantity that is stable over time with a variable electrical quantity representative of the resistance of the programmable resistor $R_{PCM}$, the comparator generating a singularity signal s, said singularity being generated when the difference between the two electrical quantities changes sign.

According to one aspect of the invention, the reference electrical quantity is representative of a reference resistance $R_{reference}$.

A programming module, for example, initializes the resistor $R_{PCM}$ by emitting an electrical pulse, said pulse being such that the resistance of the resistor $R_{PCM}$ attains the initial value $R_0$.

In one embodiment, the characteristics of the electrical pulse used to program the resistor $R_{PCM}$ are defined using a look-up table.

According to another aspect of the invention, the signal s may take two states, the singularity corresponding to the passage from one state to the other.

The comparator is for example a current comparator, and the variable electrical quantity and the reference electrical quantity are currents.

Alternatively, the comparator may be a voltage comparator and the variable electrical quantity and the reference electrical quantity are voltages.

In another embodiment, the value of $R_0$, allowing a given delay T to be obtained, is defined using the expression:

$$R_0 = R_{reference} \times \left(\frac{t_0}{T}\right)^v$$

where:
R is the resistance of the PCM material at time t;
$R_0$ is the resistance of the PCM material at an initial time $t_0$; and
v is a constant that depends on the chalcogenide used.

According to another aspect of the invention, the chalcogenide used is a mixture of germanium, antimony and tellurium.

According to another aspect of the invention, the chalcogenide used is $Ge_2Sb_2Te_5$.

Another subject of the invention is a system for inhibiting artificial neurons comprising a neural network, the time after which the output of the neural network is available being controlled by a delay generator such as described above.

A notable advantage of the invention is that it is not necessary to manufacture additional circuits dedicated to generating delays for systems already comprising phase-change materials.

BRIEF DESCRIPTION OF THE DRAWINGS

Other features and advantages of the invention will become clear by virtue of the following non-limiting description given by way of illustration and with regard to the appended drawings, in which.

DETAILED DESCRIPTION

Figure 1:
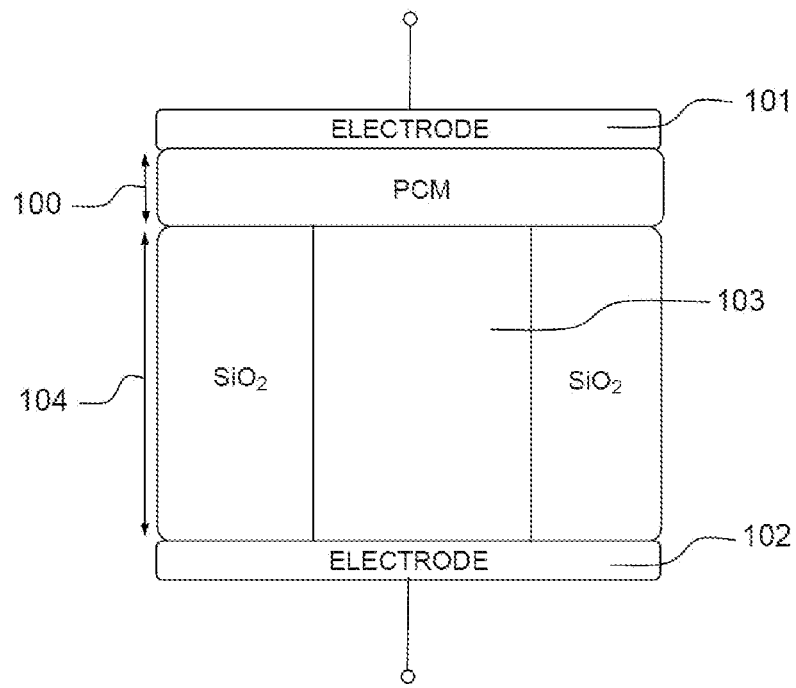
FIG. 1 gives an example of a programmable resistor based on a phase-change material.

FIG. 1 gives an example of a programmable resistor based on a phase-change material. Phase-change materials are frequently used in electronics. They are customarily referred to as phase change memory (PCM) materials. PCM materials are made from chalcogenide. They are notably used in optical storage media such as compact disks (CDs), digital versatile disks (DVDs) or Blu-ray disks. PCM materials have also been used in the development of mass-produced non-volatile electronic memory elements called phase-change random access memory (PRAM) elements.

Devices employing PCM materials operate on the principle of reversible switching of the chalcogenide between two states. Switching is induced by Joule heating. The first state of the chalcogenide material is customarily denoted by the expression "amorphous phase" and the second state by the expression "crystalline phase". An important property of chalcogenides is that their electrical resistance is higher in the amorphous phase than in the crystalline phase.

Devices based on PCM materials customarily comprise at least one programmable resistor. The exemplary programmable resistor shown in FIG. 1 consists of a thin film 100 of chalcogenide material 100 nm in thickness and an intermediate film 104, 400 nm in thickness—these two films being placed between two metallic electrodes 101, 102. By way of example, the chalcogenide used in this programmable resistor may be a mixture of germanium, antimony and tellurium, such as $Ge_2Te_2Sb_5$, for example.

The intermediate film 104 consists of a cylindrical sheet 103 made of tungsten 300 nm in diameter, said sheet being surrounded with silicon oxide $SiO_2$. Many chalcogenide-based programmable resistor architectures can be found in the prior art and may be used in the context of the invention.

When a potential difference is applied between the two metallic electrodes of the programmable resistor current flows through the cylindrical tungsten sheet 103 and through the film 100 of PCM material. Joule heating, caused by this current flow, increases the temperature of the PCM material.

To make the PCM material switch from the crystalline phase to the amorphous phase a large current pulse a few tens of nanoseconds in length is used, for example, to heat the PCM material to its melting point. The current is then rapidly cut off, i.e. in a few nanoseconds. This allows the chalcogenide to be fixed in the amorphous phase.

By way of example, to switch the PCM material from the amorphous phase to the crystalline phase, a lower-amplitude current pulse is applied so that the temperature of the PCM material exceeds its crystallization temperature without however exceeding its melting point. The material is kept at this temperature for a sufficient amount of time for the material to crystallize perfectly. With regard to the example in FIG. 1, a pulse having a pulse length of between 50 and 150 ns completely crystallizes the PCM material of the programmable resistor. It will be noted that the optimum pulse length depends on the PCM material chosen.

Figure 2:
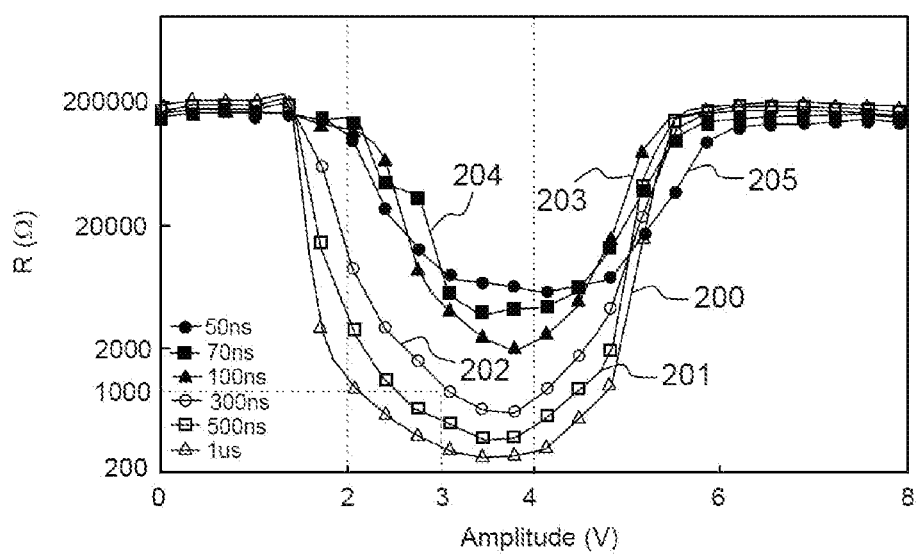
FIG. 2 shows a set of curves illustrating how the resistance of a phase-change material varies for different pulse lengths.

FIG. 2 shows a set of curves illustrating how the resistance of a PCM material varies for various electrical pulse lengths, and as a function of the amplitude of the electrical pulses used. In this example, the PCM material is initially in the amorphous phase. Six curves are shown. The first curve 200 corresponds to an electrical pulse length of 1 µs, the second 201 to a pulse length of 500 ns, the third 202 to a pulse length of 300 ns, the fourth 203 to a pulse length of 100 ns, the fifth 204 to a pulse length of 70 ns and the sixth 205 to a pulse length of 50 ns.

It may be seen that the PCM material can be crystallized in a way such that a resistance of a few hundred ohms is obtained. To do this, pulses the voltage of which lies between 2 and 4 volts may be used. In order to obtain a higher resistance in the amorphous phase, a voltage pulse of more than 4 volts may be used. These values are given by way of example and will vary depending on the architecture of and the materials used in the programmable resistor.

An important property of PCM materials is that, in the amorphous phase, the resistance drifts over time. This drift is the consequence of structural relaxation in regions of the chalcogenide in the amorphous phase. In contrast, this drift is negligible when the material is in the crystalline phase. It will be noted that, in the amorphous phase, the resistance drift increases with time. This resistance drift is deterministic and may be expressed using the following relationship:

$$R = R_0 \times \left(\frac{t}{t_0}\right)^v \qquad (1)$$

where:
R is the resistance of the PCM material at time t;
$R_0$ is the resistance of the PCM material at an initial time $t_0$, for example the time when said resistor is programmed; and
v is a parameter that depends on the chalcogenide used; by way of example, if $Ge_2Te_2Sb_5$ is used, the value of v lies between 0.11 and 0.13.

Figure 3:
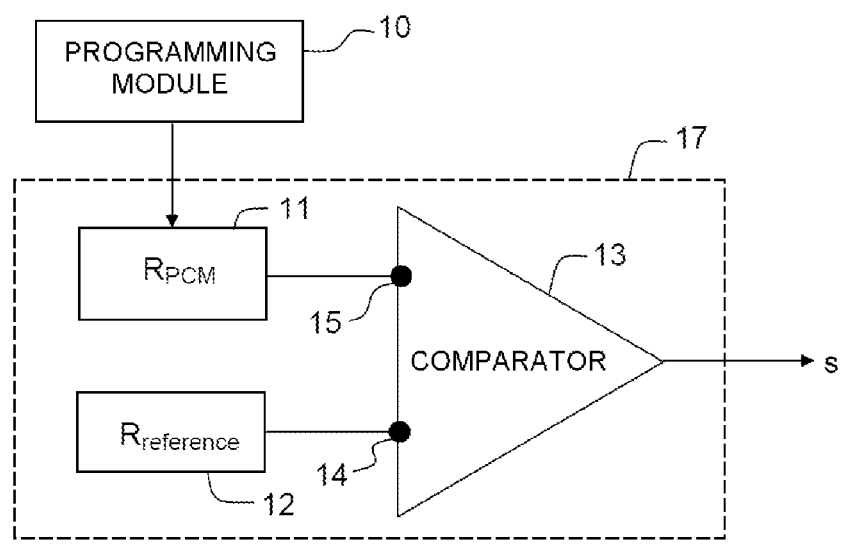
FIG. 3 illustrates, in a simplified way, the principle of delay generation according to the invention.

FIG. 3 illustrates, in a simplified way, the principle of delay generation according to the invention. The principle exploits the resistance-drift property of PCM materials in the amorphous phase. The delay generator comprises at least one programmable resistor 11 made of a PCM material, a reference resistor 12, and a comparator 13 of electrical quantities. Details of these various elements are given below in the rest of the description.

The reference resistor $R_{reference}$ 12 is connected to one of the input terminals 14 of the comparator 13. The resistance of the reference resistor $R_{reference}$ is either fixed or programmable depending on the precision required and the intended application.

The programmable resistor $R_{PCM}$ is made of chalcogenide.

In order to select an initial value $R_0$ for the resistor $R_{PCM}$, a programming module 10 may be used. The resistor is programmed by applying a suitable electrical pulse. The characteristics of the electrical pulse used to program the resistor $R_{PCM}$ may be defined using a table of values. This table of values for example represents curves of an electrical characteristic, of the same type as those shown in FIG. 2. This look-up table allows the characteristics of the pulses to be generated, varying depending on the chalcogenide used, to be defined.

The programming module 10 is implemented using for example an electrical-pulse generator external to the delay generator. Alternatively, the programming module may be included in the delay generator. By way of example, a pulse generator may be integrated into an electronic chip. There are a number of techniques well known to those skilled in the art that allow electrical pulses to be generated. The choice of electrical-pulse generation technique for example depends on the requirements of the applications for which the delay generator is used, and on the desired precision.

The aim of the comparator 13 incorporated in the delay generator is to compare the electrical quantities delivered to its inputs 14, 15. In the example in FIG. 3, the electrical quantities delivered to the first 14 and second 15 inputs of the comparator 13 are representative of the resistance of the reference resistor $R_{reference}$ 12 and the resistance of the programmable resistor $R_{PCM}$ 11, respectively. These electrical quantities are for example currents or voltages.

The comparator 13 produces an output signal s. By way of example, this output signal may take two states, a state LOW and a state HIGH or else two values, 0 and 1.

The change of state of the signal s occurs a time T after the initialization of the resistor $R_{PCM}$, said time T corresponding to the value of the delay that it is desired to generate.

Many ways or means for comparing electrical quantities representative of the resistances of the resistors $R_{PCM}$ and $R_{reference}$ may be found in the prior art. These electrical quantities representative of the resistances of the resistors $R_{PCM}$ and $R_{reference}$ are for example voltages or currents. Thus, the comparator 13 may be a voltage comparator or a current comparator, for example.

Thus, in order to generate a delay of length T, an initial value $R_0$ is chosen and the resistor $R_{PCM}$ is programmed with this initial value. It is then essential for the chalcogenide to be in the amorphous phase in order for the resistance-drift effect to take place.

To define the value of $R_0$, the following expression, derived directly from equation (1), may be used:

$$R_0 = R_{reference} \times \left(\frac{t_0}{T}\right)^v \qquad (2)$$

It will be noted that the choice of the chalcogenide used in the resistor $R_{PCM}$ determines the value of the parameter v.

The electrical quantity delivered to the second input 15 of the comparator 13 is representative of the resistance of the resistor $R_{PCM}$ and therefore varies over time.

The initialization of the delay generator corresponds to the programming of the programmable resistor with the initial value. Following initialization of the generator, the resistance of the resistor $R_{PCM}$ starts to drift because the resistor comprises a chalcogenide in the amorphous phase.

The following convention may then be used. When the electrical quantity representative of the resistance of the programmable resistor $R_{PCM}$ is lower than the reference electrical quantity, the comparing module generates an output signal s in a first state. When the electrical quantity representative of the resistance of the programmable resistor is higher than the reference electrical quantity, the signal s switches to its second state. Thus, when the difference between the two electrical quantities changes sign, a transition between the first and second states of the signal s occurs. This transition corresponds to a singularity in the signal s allowing the delay T generated to be detected.

Advantageously, the flexibility with which the programmable resistor $R_{PCM}$ can be programmed makes it possible for the resistor $R_{PCM}$ to generate time-delays with a very large range of values, for example from one millisecond to several hundred minutes.

Figure 4:
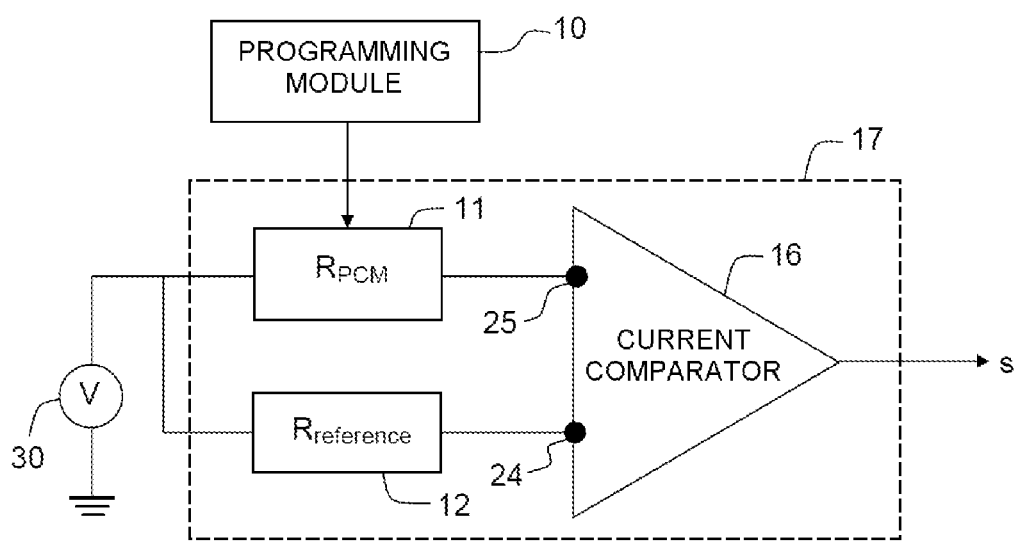
FIG. 4 shows one embodiment of the invention, employing a current comparator.

FIG. 4 shows an embodiment of the invention using a current comparator. The current delivered to the first input 24 of the current comparator 16 is compared with the current delivered to the second input 25 of the comparator.

In this example, the reference resistor 12 is connected to the first input 24 and to a voltage generator 17. The programmable resistor 11 is connected to the second input 25 and to the voltage generator 17. The currents delivered to the first 24 and second 25 inputs of the current comparator 16 are electrical quantities that depend on the resistances of the resistors $R_{reference}$ 12 and $R_{PCM}$ 11, respectively. Since the resistance of the resistor $R_{reference}$ is stable over time, the current at the first input 24 is used as the reference electrical quantity. The greater the resistance of the resistor $R_{PCM}$, the lower the current at the second input 25 of the comparator 16.

When the current at the first input 24 of the comparator 17 is higher than the current at the second input 25 of the comparator, the output signal s of the comparator is in a first state.

When the current at the first input 24 of the comparator 17 is lower than the current at the second input 25 of the comparator, the output signal s of the comparator is in a second state.

The transition between the two states of the signal s then occurs T seconds after initialization of the resistor $R_{PCM}$. The change of state of the signal s corresponds to a singularity, allowing the time T to be detected.

More generally, in the context of the invention, any signal s that produces a singularity when the sign of the difference between the reference electrical quantity and the variable electrical quantity changes may be used. This singularity may for example be a spike or a signal portion with pre-set characteristics.

Figure 5:
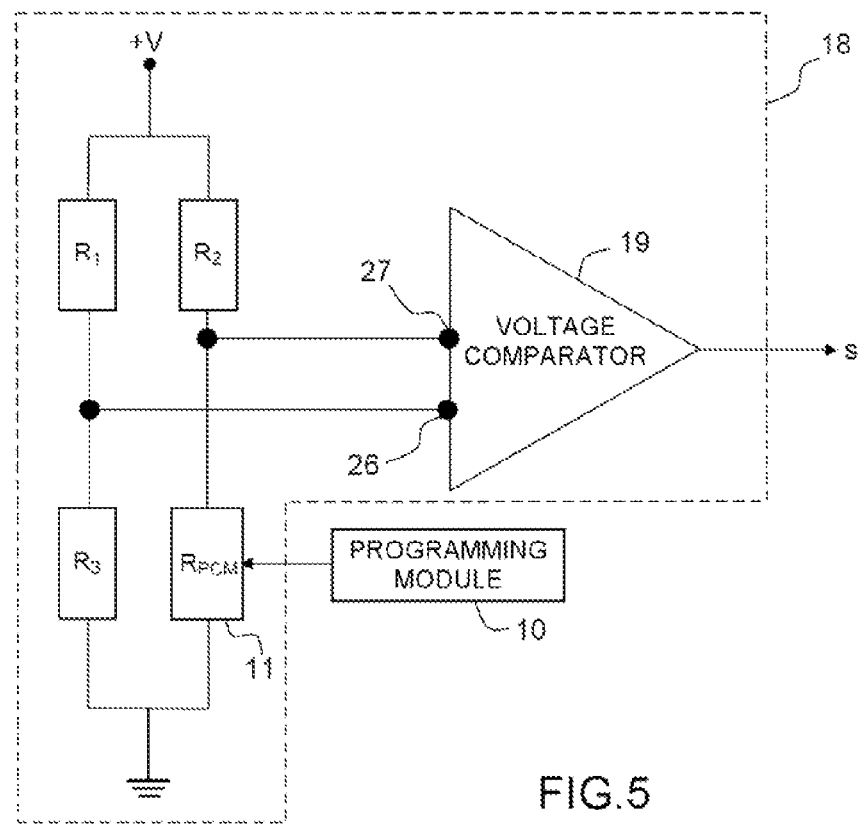
FIG. 5 shows one embodiment of a delay generator, employing a voltage comparator.

FIG. 5 shows an embodiment of a delay generator using a voltage comparator. The voltage of the first terminal 14 of the voltage comparator 19 is compared with the voltage of the second terminal 15 of said comparator 19. In this embodiment, a bias voltage V is applied to a bank of resistors. This bank is produced using two sets of two resistors, the resistors being mounted in series and the two sets of two resistors then being connected in parallel so that the voltage V can be applied to each resistor. The first set of series-connected resistors comprises two resistors R1 and R3 and the second set of series-connected resistors comprises a resistor R2 and a programmable resistor $R_{PCM}$ 11 made of chalcogenides. The first input 26 of the voltage comparator 19 is supplied a first voltage V1 from between the resistors R1 and R3 of the first set of resistors and the second input 27 is supplied a second voltage V2 from between the resistors R2 and $R_{PCM}$ of the second set of resistors. The voltages V1 and V2 may be expressed in the following way:

$$V1 = \frac{V}{\left(1 + \frac{R1}{R3}\right)} \quad V2 = \frac{V}{\left(1 + \frac{R2}{R_{PCM}}\right)}$$

The resistors R1, R2 and R3 have values that remain constant over time. Thus, the voltage V1 is constant and acts as the reference electrical quantity. As for the resistor $R_{PCM}$, it is subject to the deterministic resistance-drift effect when the chalcogenide is in its amorphous phase. The voltage V2 varies over time according to a deterministic relationship. Programming $R_{PCM}$ with an initial value $R_0$ allows a value for a delay T to be generated, to be chosen. A programming module 10, internal or external to the generator, may be used to select this initial value. The resistances of the resistors R1, R2 and R3 may be chosen depending on the intended application.

The delay generator according to the invention may be used in the context of many applications. In particular, it may be used in any system for producing long time-delays. It may for example be used as a programmable timer. In a completely different field, the time-delay generator may be used to program models of neuron spikes.

Figure 6:
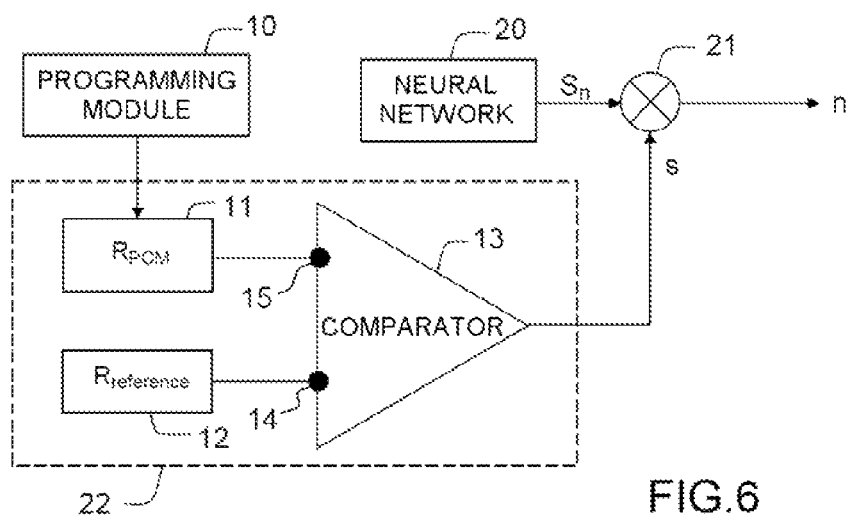
FIG. 6 gives an exemplary system for programming a model of neuron spikes.

FIG. 6 gives an exemplary system for programming a sequence of pulses similar to those emitted by neurons. Conventional neural impulses may be used for example. The neural impulse signals may be simulated or generated by a CMOS chip 20 using VLSI circuits.

In this example, the convention chosen is that the signal s may take a first and a second state corresponding to values of 0 and 1, respectively.

The output $S_n$ of the neural network 20 is combined 21 with the output s of the delay generator. A spike output by the neural network 20 will be detected via the signal n only for the period when the output s of the generator equals 1. No spike will be detected when the signal s is at 0. Thus, by controlling the time after which the output of the neural network may be observed, the model of the final spike may be controlled. Implementing this technique allows the size of the CMOS chip 20 to be reduced. Specifically, a large number of transistors and therefore a large area of the chip 20 is customarily used to implement a circuit for controlling the time-delay between two successive spikes. It is possible for the time-delays between consecutive spikes to be extremely long. These time-delays are difficult to produce with conventional capacitor-based time-delay generators.

The invention claimed is:

1. A delay generator comprising at least one programmable resistor $R_{pcm}$ made of a chalcogenide-based phase-change material, said resistor $R_{PCM}$ having a time-varying resistance with an initial value $R_0$ when the chalcogenide-based phase-change material is in an amorphous phase, and a comparator circuit configured to receive at a first input port a reference electrical quantity that is stable over time, to receive at a second input port a variable electrical quantity representative of the time-varying resistance of the programmable resistor $R_{pcm}$, to compare said reference electrical quantity and said variable electrical quantity and to generate an output signal s having a singularity, said singularity being generated when a difference between said reference electrical quantity and said variable electrical quantity changes sign.

2. The delay generator as claimed in claim 1, wherein the reference electrical quantity is representative of a reference resistance $R_{reference}$.

3. The delay generator as claimed claim 1, further comprising a programming module to initialize the resistor $R_{pcm}$ by emitting an electrical pulse configured to set the resistance of the resistor $R_{pcm}$ at said initial value $R_0$.

4. The delay generator as claimed in claim 3, wherein said programming module is configured to define characteristics of said electrical pulse by using a look-up table representative of curves of an electric characteristic of the programmable resistor.

5. The delay generator as claimed in claim 1, wherein said comparator circuit is configured to generate the output signal s taking two states, the singularity corresponding to a passage from one state of the output signal to the other.

6. The delay generator as claimed in claim 1, wherein the comparator circuit is a current comparator and wherein the variable electrical quantity and the reference electrical quantity are currents.

7. The delay generator as claimed in claim 1, wherein the comparator circuit is a voltage comparator and wherein the variable electrical quantity and the reference electrical quantity are voltages.

8. The delay generator as claimed in claim 1, wherein the value of $R_0$, allowing a given delay T to be obtained, is defined using the expression:

$$R = R_0 \times \left(\frac{t_0}{T}\right)^v,$$

where:

R is the resistance of the phase-change material at time t;

$R_0$ is the resistance of the phase-change material at an initial time $t_0$; and v is a constant that depends on the chalcogenide-based phase-change material used.

9. The delay generator as claimed in claim 1, wherein the chalcogenide-based phase-change material is a mixture of germanium, antimony, and tellurium.

10. The delay generator as claimed in claim 9, wherein the chalcogenide-based phase-change material is $Ge_2Sb_2Te_5$.

11. A system for inhibiting artificial neurons comprising a neural network and a delay generator as claimed in claim 1, said delay generator being configured to control the time after which the output of the neural network is available.

* * * * *